US 6,527,856 B2

(12) United States Patent
Abraham et al.

(10) Patent No.: US 6,527,856 B2
(45) Date of Patent: Mar. 4, 2003

(54) METHOD FOR CHANGING SURFACE TERMINATION OF A PEROVSKITE OXIDE SUBSTRATE SURFACE

(75) Inventors: David W. Abraham, Croton-on-Hudson, NY (US); Matthew Copel, Yorktown Heights, NY (US); James Misewich, Peekskill, NY (US); Alejandro G. Schrott, New York, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 09/792,040

(22) Filed: Feb. 22, 2001

(65) Prior Publication Data

US 2002/0002942 A1 Jan. 10, 2002

Related U.S. Application Data

(60) Provisional application No. 60/198,803, filed on Apr. 20, 2000.

(51) Int. Cl.[7] .............................................. C30B 25/02
(52) U.S. Cl. .................. 117/97; 117/1; 117/2; 117/105; 423/328.2
(58) Field of Search .......................... 117/1, 2, 97, 103; 505/729

(56) References Cited

U.S. PATENT DOCUMENTS

| | | | | |
|---|---|---|---|---|
| 5,498,561 A | * | 3/1996 | Sakuma et al. | 438/450 |
| 5,650,377 A | * | 7/1997 | Kern et al. | 505/330 |
| 5,849,207 A | * | 12/1998 | Sato | 216/76 |
| 5,855,668 A | | 1/1999 | Kawasaki et al. | 117/2 |

FOREIGN PATENT DOCUMENTS

JP         06295993 A    * 10/1994

OTHER PUBLICATIONS

R. Tsuchiya et al., YBa$_2$Cu$_3$O$_{7-\delta}$trilayer junction with nm thick PrGaO$_3$ barrier, Appl. Phys. Lett. vol. 71; No. 11 (Sep. 15, 1997). p. 1–3.

T. Ohnishi et al., A–site layer terminated perovskite substrate: NdGaO$_3$, Appl. Phys. Lett. vol. 74; No. 17 (Apr. 26, 1999). p. 2531–2533.

* cited by examiner

*Primary Examiner*—Felisa Hiteshew
(74) *Attorney, Agent, or Firm*—Casey P. August; Domenica N. S. Hartman; Gary M. Hartman

(57) ABSTRACT

A method for changing the surface termination of a perovskite substrate surface, an example of which is the conversion of B-site terminations of a single-crystal STO substrate to A-site terminations. The method generally comprises the steps of etching the substrate surface by applying a reactive plasma thereto in the presence of fluorine or another halogen, and then annealing the substrate at a temperature sufficient to regenerate a long range order of the surface, i.e., the surface termination contributes to a better long range order in a film epitaxially grown on the surface. More particularly, the resulting substrate surfaces predominantly contains A-site surface terminations, i.e., SrO for STO (100) substrates. As a result, disadvantages associated with B-site terminated perovskite substrate surfaces are avoided. A suitable etching treatment is a low power oxygen ashing in the presence of low halogen levels. A-site terminated surfaces produced by this invention allow for the epitaxial growth of heterostructures, such as cuprate films for use as high-T$_c$ superconductor films, Josephson tunnel junctions, superlattices and OxFET, with improved quality.

28 Claims, 2 Drawing Sheets

METHOD FOR CHANGING SURFACE TERMINATION OF A PEROVSKITE OXIDE SUBSTRATE SURFACE

CROSS REFERENCE TO RELATED APPLICATIONS

This application claims the benefit of U.S. Provisional Application No. 60/198,803, filed Apr. 20, 2000.

BACKGROUND OF THE INVENTION

1. Field of the Invention

The present invention generally relates to surface treatments of substrate materials. More particularly, this invention relates to a process for treating the surface of a perovskite oxide substrate used for epitaxial growth of heterostructures, by which the quality of the epitaxial growth is promoted by changing the surface termination of the substrate.

2. Description of the Prior Art

Perovskite oxide single-crystal substrates are widely used for epitaxial growth of heterostructures, such as high-$T_c$ superconductor films, Josephson tunnel junctions, superlattices, and oxide-channel field emission transistors (OxFET). As an example, strontium titanate ($SrTiO_3$; STO) substrates have been used to grow high-$T_c$ superconducting cuprate thin films such as $YBa_2Cu_3O_{7-\delta}$ (YBCO). An atomically flat substrate surface is essential for accomplishing a perfect two-dimensional epitaxial growth from a perovskite substrate. In U.S. Pat. No. 5,855,668 to Kawasaki et al., single-crystal STO substrates with surface roughnesses of 5 Angstroms and less were obtained through a chemical etching process in buffered HF. Surface termination also plays an important role in film growth on perovskite substrates, including the ability to obtain perfect two-dimensional epitaxy of heterostructures. For example, it has been reported that pulsed laser deposition (PLD) of YBCO is strongly affected by the surface layer termination of STO (100) substrates. The surface termination of a perovskite substrate may additionally influence the electronic conductivity of thin films grown on perovskite substrates by such methods as PLD.

STO and other perovskite oxides used for epitaxial growth of heterostructures have the general formula $A_xA'_{1-x}BO_3$, where A is a rare earth metal (e.g., lanthanum, cerium, praseodymium, neodymium, promethium, samarium, europium, gadolinium, terbium, dysprosium, holmium, erbium, thulium, ytterbium and lutetium), A' is magnesium, calcium, strontium or barium, and B is a transition metal (e.g., titanium, vanadium, chromium, manganese, iron, cobalt, nickel and copper). Such perovskite oxides have two possible (100) surface termination layers, where the surface unit cell is either AO (A-site layer) or $BO_2$ (B-site layer). In the case of STO, A-site terminations are SrO while B-site terminations are $TiO_2$. In general, the methods that have been developed to achieve surfaces containing a single class of domain have been limited to producing B-site surface terminations, i.e., $TiO_2$ for STO (100) substrates. For example, and as reported in T. Ohnishi et al., "A-site Layer Terminated Perovskite Substrate: $NdGaO_3$," Appl. Phys. Lett. 74, 14 (1999), it is well known that chemical etching of STO (such as Kawasaki et al.) results in $TiO_2$ terminated surfaces. Unfortunately, undesirable $CuO_x$ precipitates have been found in cuprate heterostructures epitaxially grown on the $TiO_2$ terminated surfaces of STO (100). A solution proposed in the prior art is to deposit a monolayer of SrO on a B-site terminated STO (100) substrate, which has been shown to result in a homogeneous layer-by-layer growth. For this purpose, a monolayer of SrO can be deposited, by ablating a strontium or strontium oxide target in an oxygen-containing atmosphere. However, significant drawbacks with this approach include the requirement for strict control of the deposition rate, and the possibility of undesired doping effects during epitaxial growth of certain oxides.

From the above, it can be seen that it would be desirable to provide a more facile method to produce A-site terminated perovskite substrates for epitaxial growth of heterostructures, such as high-$T_c$ superconductor films, Josephson tunnel junctions, superlattices, and OxFET.

BRIEF SUMMARY OF THE INVENTION

The present invention provides a method for changing the surface termination of a perovskite substrate surface, an example of which is the conversion of B-site terminations of a single-crystal STO substrate to A-site terminations. The method generally comprises etching the substrate surface by applying a reactive plasma thereto in the presence of low concentrations of halogens, during which B-site terminations are converted to A-site terminations. More particularly, the resulting substrate surface predominantly contains A-site surface terminations, i.e., SrO for STO (100) substrates. Because plasma etching leaves a disordered surface, the substrate is then preferably heated to a temperature sufficient to regenerate a long range order of the surface. A suitable heat treatment can effectively occur during the process of heating the substrate prior to depositing a film on the A-site terminated substrate surface. The proper surface termination contributes to a better long range order in a film epitaxially grown on the surface. In addition, disadvantages associated with B-site terminated perovskite substrate surfaces are avoided, including the propensity for undesirable $CuO_x$ precipitates found in cuprate heterostructures epitaxially grown on B-site terminated surfaces of STO (100).

A suitable etching treatment is a low power oxygen ashing in the presence of low levels of a halogen. Accordingly, the present invention provides a more facile method for producing A-site terminated substrates, as in comparison to the deposition of a monolayer of SrO on a B-site terminated STO (100) substrate, as proposed in the prior art. In addition, the present invention avoids unwanted doping effects in the epitaxial film caused by excess SrO, deficient stoichiometry, unwanted precipitates caused by insufficient strontium deposition, or faulty epitaxy caused by excess strontium deposition. Another advantage is that the solution provided by the present invention is part of the preparation of the substrate prior to deposition of an epitaxial film, and can therefore be more readily controlled. Consequently, heterostructures epitaxially grown on A-site terminated surfaces produced by this invention allow for the deposition of cuprate films with improved quality, which in turn renders such films more suitable for use as high-$T_c$ superconductor films, Josephson tunnel junctions, superlattices and OxFET.

Other objects and advantages of this invention will be better appreciated from the following detailed description.

DETAILED DESCRIPTION OF THE INVENTION

Figure 1:
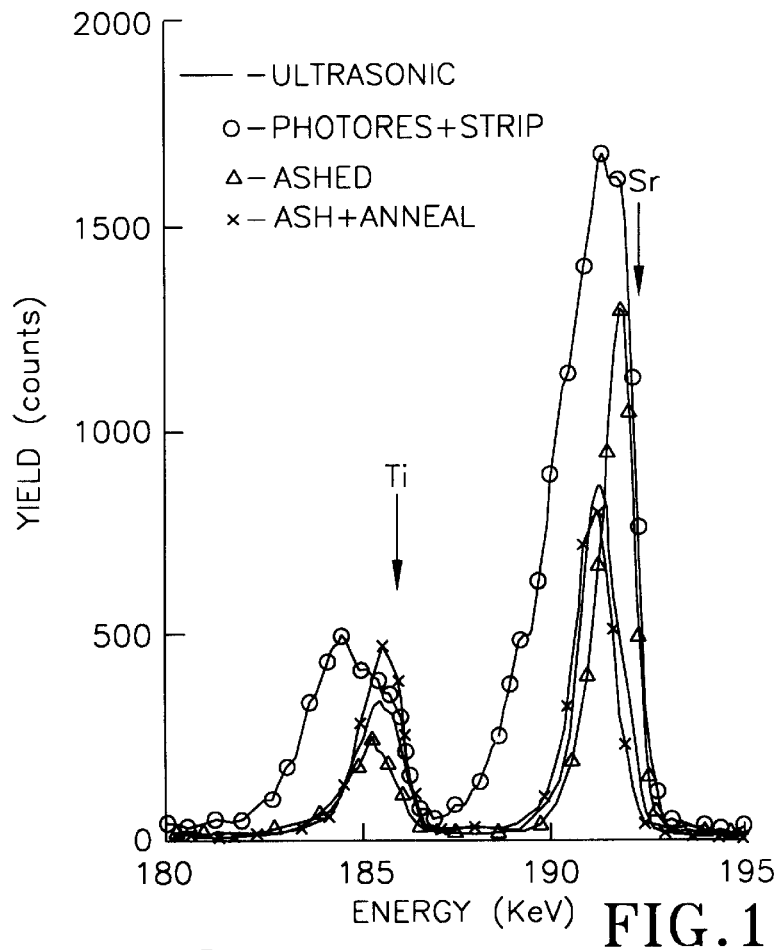
FIG. 1 is a graph representing the ion scatting spectra for STO (100) substrates processed by different surface treatments, including a one-minute ashing treatment alone and in combination with a post-etch anneal performed in accordance with the present invention.

The present invention provides a method for improving the surface of a perovskite oxide single-crystal substrate for epitaxial growth of heterostructures of various materials, notable examples being high-$T_c$ superconducting cuprate thin films such as YBCO, $(La_xSr_{1-x})_2CuO_4$ and their respective 123 and 214 families of high-$T_c$ compounds. As known in the art, the 123 family of high-$T_c$ compounds includes $YBa_2Cu_3O_y$, $NdBa_2Cu_3O_y$, $SmBa_2Cu_3O_y$, $EuBa_2Cu_3O_y$, $GdBa_2Cu_3O_y$, $DyBa_2Cu_3O_y$, $HoBa_2Cu_3O_y$, $YbBa_2Cu_3O_y$, $LuBa_2Cu_3O_y$, $Y_{0.5}Sc_{0.5}Ba_2Cu_3O_y$, $Y_{0.5}La_{0.5}Ba_2Cu_3O_y$, $Y_{0.5}Lu_{0.5}Ba_2Cu_3O_y$, $YSrCaCu_3O_y$, $YBaSrCu_3O_y$, $YBaSrCaCu_3O_y$, $YbBaSrCu_3O_y$ and $YbBaCaCu_3O_y$, and the 214 family includes the $(La_{0.85}Ln_{0.05}Sr_{0.1})_2CuO_4$ compounds, where Ln is Pr, Nd, Sm, Eu, Gd, Tb, Dy, Ho, Er or Tm. It is foreseeable that the invention is also applicable to the epitaxial growth of other materials. The method of the present invention produces an atomically flat substrate surface (surface roughness of 5 Angstroms and less) in order to promote perfect two-dimensional epitaxial growth, and also provides A-site surface termination to further improve the quality of the epitaxial growth. A further feature of the invention is an apparent improvement in the electronic conductivity of the epitaxial thin film, particularly for those grown by such methods as PLD. While the invention will be discussed in particular reference to STO substrates, it is believed that the teachings of the invention are applicable to other perovskite oxides with the base formula $ABO_3$ in which the halide of B is volatile.

In an investigation leading to the present invention, 10×10×0.5 mm substrates of single-crystal STO pieces were polished and chemically etched in accordance with U.S. Pat. No. 5,855,668 to Kawasaki et al., involving a wet chemical etch using hydrofluoric acid solution to dissolve two-dimensional-lattice atomic layers in the substrate surfaces. All of the samples then underwent sequential ultrasonic cleaning in acetone, isopropanol and ethanol. One of the samples was set aside as a control sample, while a second was coated with spun-on photoresist which was then ultrasonically stripped with solvents to reproduce the treatment from a metal lift-off process, as known in the art. Still other cleaned samples underwent a mild reactive ion etching (RIE), or "ashing," in oxygen gas for one minute. The ashing process was performed in a parallel plate, reactive ion etching tool, model Jupiter III, plasma system, commercially available from March Instruments, of Concord, Calif. USA. The ashing chamber dimensions were about 25 cm in diameter by about 3.25 cm in height. The oxygen gas was flowed at about 500 mTorr, and low energy ions were delivered by plasma using a power level of about 50 watts at 13.56 MHZ. After the ashing step, all of the samples were analyzed with Medium Energy Ion Scattering (MEIS) (taken with an incident beam of 200 KeV helium ions), atomic force microscopy (AFM) and X-ray photoemission spectroscopy (XPS). The ashed samples were then annealed in oxygen at a temperature of about 700° C. for the purpose of mimicking the temperature experienced during pulsed laser deposition (PLD). The annealed samples were then analyzed for a second time with ion scattering, AFM and XPS.

The ion scatting (MEIS) data collected by the investigation are represented in FIG. 1. The sample that underwent ultrasonic resist stripping did not produce any significant compositional changes at the substrate surface with respect to the (100) surface of the control sample. In contrast, the ashing process had a remarkable effect on the surface composition with respect to the original surface. Specifically, the ion scattering spectrum for the ashed sample shows that the peaks corresponding to strontium and titanium exhibited a noticeable broadening, indicating a high degree of disorder. In addition, this spectrum showed that the signal from strontium at the substrate surface (the signal closest to the energy position indicated by the arrow labeled "Sr" at approximately 193 KeV) had increased in comparison to the surface strontium signals of the samples that had only undergone chemical etching and resist stripping. In contrast, the signal from surface titanium (the signal closest to the energy position indicated by the arrow labeled "Ti" at approximately 187 KeV) had decreased. Therefore, the data indicated a more strontium-rich surface termination, i.e., a conversion from B-site ($BO_2$) to A-site (AO) termination of an $ABO_3$ perovskite oxide. Finally, the spectrum corresponding to the ashed sample following annealing indicated a high degree of order (evidenced by narrower peaks), as well as an inversion of the surface termination (evidenced by a shift in the peak intensities and positions). Specifically, in addition to being greater than those of the samples that only underwent chemical etching and resist stripping, the strontium peak associated with the annealed sample had moved to a higher energy position, whereas the titanium peak decreased and shifted to a lower energy position. The results of this investigation evidenced that the ashed and annealed samples were A-site terminated, in contrast to the B-site terminated samples that were chemically etched in accordance with the prior art.

AFM was used to obtain the root mean square roughness (RMSR) data for the lift-off and ashed samples. The lift-off sample was found to have a RMSR value of about 1.158 nm, while in contrast the RMSR value for the ashed sample was 0.674 nm, indicating a significantly higher degree of surface flatness. The greater roughness of the lift-off sample may be attributable in part to resist residues, which would be eliminated by ashing.

Figure 2:
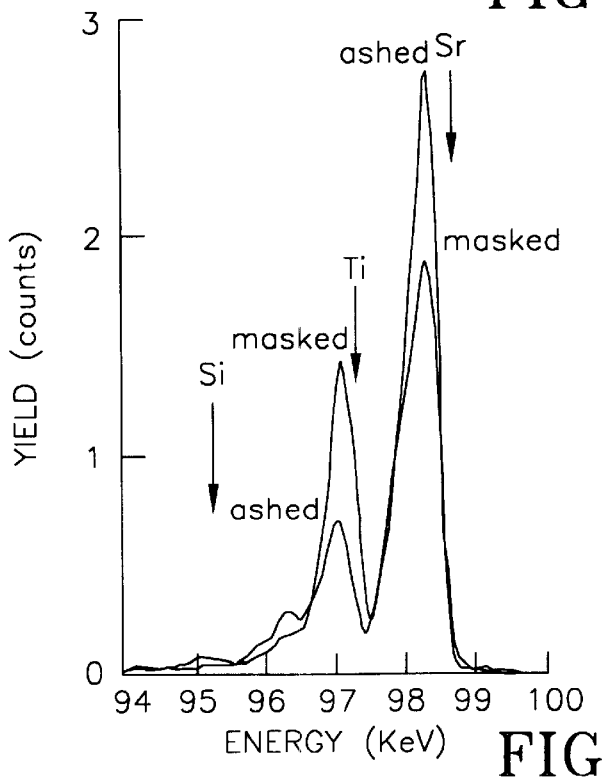
FIG. 2 is a graph representing additional ion scattering data contrasting a STO (100) substrate processed by an ashing and annealing surface treatment in accordance with the present invention, in comparison to an untreated STO (100) substrate.

An additional STO sample was then partially masked (without photoresist) and subjected to ashing under the same conditions as before, but for a duration of about 2.5 minutes. Following annealing at about 700° C. in about 100 mTorr $O_2$ for about one hour, AFM measurements of the specimen were taken. The AFM results evidenced that the ashed region was slightly smoother than the masked (non-ashed) region. The measured root mean square roughness (RMSR) of the ashed region was about 0.19 nm, as compared to about 0.24 nm for the non-ashed region. Step heights of 0.39 nm measured in the ashed region corresponded to a single STO unit cell. Ion scattering data was then collected from this sample using 100 KeV hydrogen ions. The results of this evaluation are represented in FIG. 2, and evidence an almost complete Sr termination in the substrate surface. In contrast, the ion scattering data for the masked (unashed) region evidenced this surface to be similar to a standard titanium terminated (B-site) rich surface produced by the process of Kawasaki et al.

Based on the above investigation and in conjunction with computer simulations, it was predicted that a three minute ashing step should leave an almost purely strontium-terminated STO surface. It was further predicted that additional ashing beyond three minutes would increase the amount of strontium at the treated surface and lead to a gradual build up of SrO. Such growth of bulk SrO is presumed detrimental to the epitaxial growth of a film deposited by PLD because of an increased lattice misfit.

Figure 3:
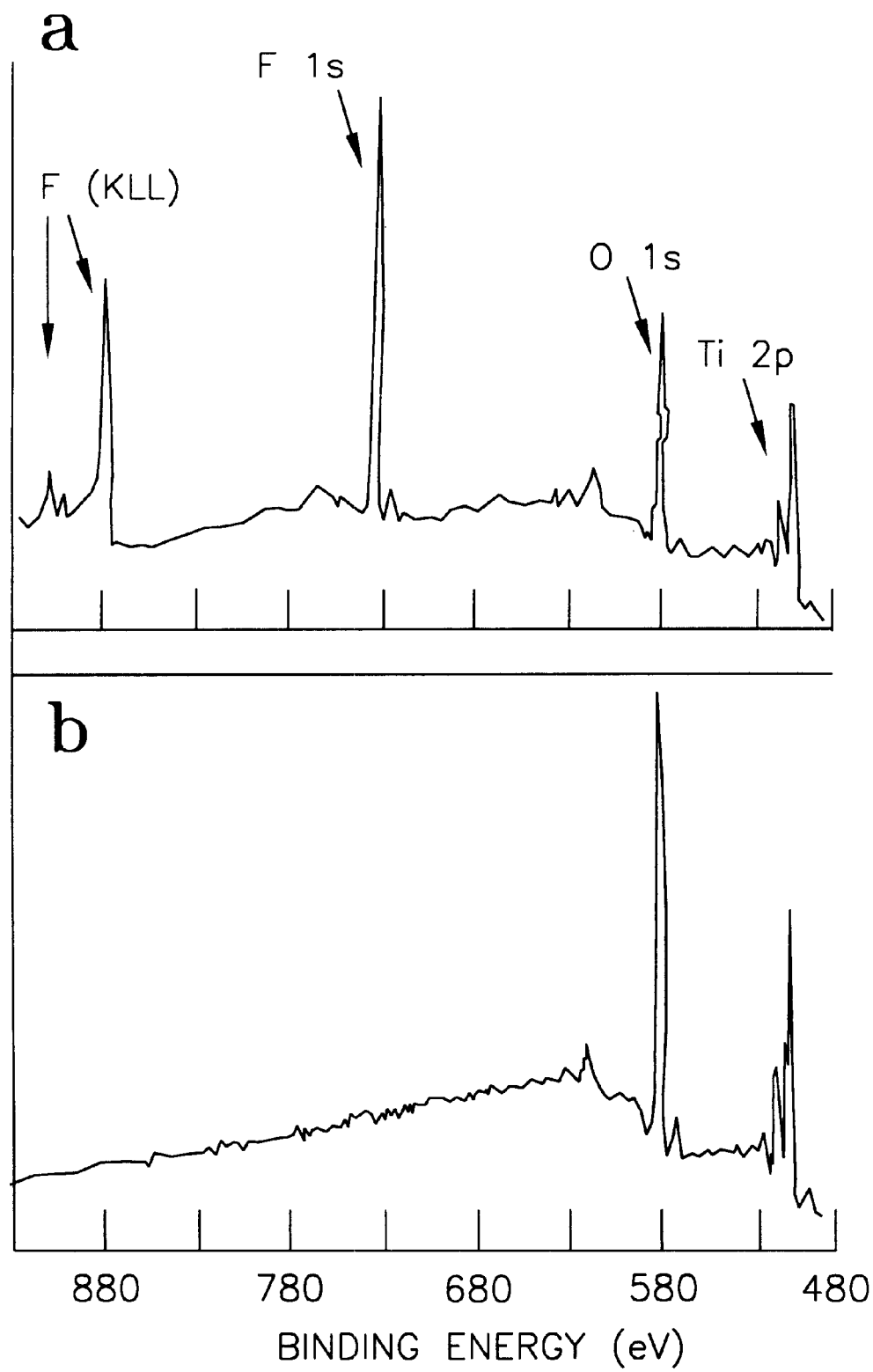
FIG. 3 is a graph representing x-ray photoemission spectroscopy scans of a STO (100) substrate following ashing and following annealing, evidencing fluorine as an etchant present during the ashing process.

In principle, one skilled in the art would not expect an oxygen plasma to etch titanium. The data of FIG. 3 suggest that fluorine was the apparent etchant species of the etching mechanism that occurred during the above investigations. In graph (a) of FIG. 3, the results of an XPS scan for one of the previous ashed samples (prior to annealing) indicate that a significant amount (approximately one monolayer) of fluorine was present at the ashed surface. The results of an XPS scan for one of the previous ashed and annealed samples are represented in graph (b) of FIG. 3, and evidence that fluorine was not present at the ashed+annealed surface. Consequently, these results suggest that fluorine was responsible for the etching mechanism.

In hindsight only, the presence of fluorine may appear reasonable since titanium tetrafluoride ($TiF_4$) is known to be volatile. However, fluorine is not and was not expected to be present in a reactive ion etching process. Unexpectedly, the presence of fluorine in the plasma was traced to the backstream of the mechanical pump of the ashing (RIE) chamber, which utilized a fluorinated oil. On further investigation, the proportion of fluorine present in the ashing chamber was determined to be very small, yet sufficient to gently etch a monolayer of titanium at the STO substrate surface in a period of about three minutes. In order to assess the proportion of fluorine present in the RIE plasma, an optical emission spectra was collected through the ashing chamber window. The relative abundance of fluorine was calculated by measuring the intensity of the fluorine atomic emission line at $\lambda_F=685.6$ nm and the intensity of the oxygen emission doublet at $\lambda_{O1}$, $\lambda_{O2}=700.19$ and 700.22 nm, respectively. In this manner, a F/O peak area ratio of about 0.05 was measured. Taking into account the tabulated relative intensities for oxygen and fluorine, the upper limit for the ratio of atomic fluorine to atomic oxygen in the plasma was assessed to be about $5 \times 10^{-4}$. Under the conditions used, this ratio in the plasma was effective in etching a monolayer of titanium in about three minutes. However, in view of the complex processes that take place in a plasma, this ratio would not reliably indicate the number for the flux of fluorine onto the substrate surface.

A subsequent investigation was then undertaken to establish the affects of ashing on the properties of a channel film epitaxially grown on the surface of STO substrates treated in accordance with this invention. For this investigation, a test structure was fabricated for measuring electrical conductivity, in which platinum electrodes were deposited on a number of STO (100) substrates by evaporation through a lithographic mask to yield test structures in all four quadrants of each sample. Following metal lift-off to leave the patterned platinum electrodes, the samples were ultrasonically cleaned in accordance with standard practices. The samples were then selectively masked and ashed, with three of the four quadrants (Q2, Q3 and Q4) of each substrate being subjected to a different ashing time, as indicated in Table I below. One quadrant (Q1) of each sample was not ashed to provide a control. PLD films of either YBCO or $La_2CuO_4$ (LCO) with thicknesses of about 10 nm were then grown on the differentially ashed quadrants of the samples. The films were grown with a KrF excimer laser with a pulse energy of about thirty mJ and a fluence of about 2 J/cm². The films were grown in a 20 to 100 mTorr $O_2$ atmosphere with the substrate at a temperature of about 700° C.

The samples processed in accordance with the above allowed for the comparison within each sample of the impact of different substrate treatments on the smoothness and conductivity of PLD film grown on the STO substrates that were ashed and annealed in accordance with this invention. Following film deposition, electrical measurements were performed to determine the DC resistivity in all four quadrants of each sample, and the surface topography of each quadrant was determined by AFM. Contact to the platinum electrodes was achieved by pushing tungsten probes through the films overlying the electrodes. The results from the AFM scans are summarized in Table I for both LCO and YBCO films. The flatnesses (RMSR) of the films are shown to improve as a result of ashing, particular for ashing times of greater than 25 seconds for LCO films and greater than 100 seconds for YBCO films. Flatter films were believed to be obtained with YBCO because of the better lattice match between YBCO and STO.

TABLE I

| Quadrant: | Q1 | Q2 | Q3 | Q4 |
| --- | --- | --- | --- | --- |
| LCO Films: | | | | |
| Ashing Time (s): | 0 | 25 | 50 | 75 |
| RMSR (nm): | 1.2 | 1.3 | 0.6 | 0.5 |
| YBCO Films: | | | | |
| Ashing Time (s): | 0 | 50 | 100 | 160 |
| RMSR (nm): | 0.6 | 0.4 | 0.5 | 0.2 |

Table II summarizes the results of the DC resistivity tests for one of the LCO samples, and evidences that there is a clear correlation between ashing time and improved conductivity.

TABLE II

| Quadrant: | Q1 | Q2 | Q3 | Q4 |
| --- | --- | --- | --- | --- |
| LCO Films: | | | | |
| Ashing Time (s): | 0 | 25 | 50 | 75 |
| Resistivity (mΩ-cm): | 136 | 176 | 81 | 77 |

Frequency dependent impedance curves of these samples also indicated a larger capacitive content in the control quadrant (Q1) of each sample as compared to quadrant Q4. Subsequent analysis of this data indicated a more granular nature of the films on the unashed quadrants.

The results summarized in Table II would appear to indicate that strontium surface termination (A-site) in an STO substrate should contribute to a better long range order in a channel film deposited on the substrate. The formation of grains at the surface of the LCO film may be partly attributed to the large lattice mismatch between LCO and STO. However, the above results suggest that strontium surface termination tends to offset any detrimental effect of the grains through an enhanced chemical interaction. A similar trend was observed with the YBCO films, though contact problems between these films and the platinum electrodes interfered with the ability to obtain quantitative conductivity data. Nevertheless, the results from Table 1 suggest that the enhanced chemical interaction provided by strontium termination is very beneficial for the growth of YBCO, which has a small lattice mismatch with STO and exhibits a very flat surface when processed in accordance with the films in the fourth quadrants (Q4) of the YBCO samples.

In summary, several issues critical to improving the quality of epitaxially-grown heterostructures on a perovskite substrate are addressed with the present invention and its method by which a B-site terminated perovskite surface is converted into an A-site terminated surface. According to one aspect of the invention, a more facile method is provided for producing A-site terminated perovskite substrates for epitaxial growth of heterostructures. More particularly, the present invention enables perovskite substrates to be processed to have an as-etched surface terminated primarily with AO surface domains, in contrast to depositing a single atomic layer of AO on a $BO_2$-terminated surface. Furthermore, the fabrication of a heterostructure such as a cuprate film on an A-site terminated perovskite substrate produced by this invention leads to improved conductivity and flatness, which are critical to the fabrication of heterostructures such as high-$T_c$ superconductor films of the 214 and 123 families, Josephson tunnel junctions, superlattices, and OxFET.

While the present invention has been described and demonstrated in reference to STO substrates and certain ashing and annealing techniques, it is believed that the invention is more broadly applicable to $ABO_3$ perovskites, and particularly $ABO_3$ perovskites in which halides of B are volatile, and the benefits of the invention can be realized using parameters outside those specifically used in the examples. For example, it is believed that a suitable reactive plasma for the ashing step can be accomplished in a flowing atmosphere of $O_2$ at pressures of about 10 to about 1000 mTorr, particularly about 50 to 500 mTorr, and containing about 10 to 1000 ppm of a halogen in the plasma, with a suitable ashing time of about one to about five minutes, though durations of as little as about thirty seconds up to about one hour are foreseeable. These parameters are believed to be suitable to achieve a relatively low etch rate that allows for monolayer control when etching STO with fluorine as the halogen specie. It is foreseeable that the etching rate will vary with the specific transition metal (B) of the perovskite oxide and the particular halogen used in the etch. Suitable annealing parameters are believed to be temperatures of about 600 to about 1200° C., particularly about 700 to about 1000° C., for durations of about one to about three hours in oxygen or a vacuum.

In view of the above, while the invention has been described in terms of particular embodiments, it is apparent that other forms could be adopted by one skilled in the art. Accordingly, the scope of the invention is to be limited only by the following claims.

What is claimed is:

1. A perovskite substrate having a composition with the base formula $ABO_3$ and having an etched surface terminated primarily with AO surface domains.

2. A perovskite substrate according to claim 1, wherein the perovskite substrate is $SrTiO_3$ and the etched surface is terminated primarily with SrO surface domains.

3. A perovskite substrate according to claim 1, wherein the etched surface of the perovskite substrate has a root mean square value of not greater than 0.5 nm following the etching step.

4. A perovskite substrate according to claim 1, further comprising an epitaxially-grown heterostructure on the etched surface of the substrate.

5. A perovskite substrate according to claim 4, wherein the heterostructure is chosen from the group consisting of high-$T_c$ superconductor films, Josephson tunnel junctions, superlattices, and oxide channel field effect transistors.

6. A perovskite substrate according to claim 4, wherein the heterostructure is a cuprate film.

7. A perovskite substrate according to claim 4, wherein the heterostructure has a composition chosen from the group consisting of $YBa_2Cu_3O_{7-\delta}$, $La_2CuO_4$ and their families.

8. A method for changing a surface termination of a surface of a perovskite substrate, the method comprising the steps of:

etching the surface by applying a reactive plasma thereto in the presence of a halogen; and then heating the substrate to a temperature sufficient to regenerate a long range order of the surface.

9. A method according to claim 8, wherein the etching step is performed by an oxygen ashing treatment.

10. A method according to claim 8, wherein the reactive plasma contains about 10 to 1000 ppm of the halogen.

11. A method according to claim 8, wherein the perovskite substrate has a composition with the base formula $ABO_3$, and wherein the surface termination of the surface is characterized by primarily $BO_2$ surface domains prior to the etching step.

12. A method according to claim 11, wherein the etching step changes the surface termination of the surface from primarily $BO_2$ surface domains to primarily AO surface domains as a result of there being a sufficient amount of halogen to etch a monolayer of the $BO_2$ surface domains during the etching step.

13. A method according to claim 8, wherein the perovskite substrate is $SrTiO_3$ and the surface termination of the surface is characterized by primarily $TiO_2$ surface domains prior to the etching step.

14. A method according to claim 13, wherein the etching step changes the surface termination of the surface from primarily $TiO_2$ surface domains to primarily SrO surface domains as a result of there being a sufficient amount of halogen to etch a monolayer of the $TiO_2$ surface domains during the etching step.

15. A method according to claim 13, wherein the temperature of the heating step is in the range of about 600 to about 1200° C.

16. A method according to claim 8, wherein the etching step is performed in a flowing atmosphere of oxygen at a pressure of about 10 to about 1000 mTorr.

17. A method according to claim 8, wherein the surface of the perovskite substrate has a root mean square roughness value of not greater than 0.5 nm following the etching step.

18. A method for changing a surface termination of a surface of a single-crystal $SrTiO_3$ substrate characterized by primarily $TiO_2$ surface domains, the method comprising the steps of:

selectively etching the surface by subjecting the surface to reactive ion etching in oxygen and a sufficient amount of fluorine to change the surface termination of the surface from primarily $TiO_2$ surface domains to primarily SrO surface domains; and then annealing the substrate at a temperature of about 600 to about 1200° C. to regenerate a long range order of the surface.

19. A method according to claim 18, wherein the etching step is performed in a flowing atmosphere of oxygen at a pressure of about 10 to about 1000 mTorr.

20. A method according to claim 18, wherein about 10 to 1000 ppm of fluorine is present in the plasma during reactive ion etching.

21. A method according to claim 18, wherein the surface of the substrate has a root mean square value of not greater than 0.5 nm following the etching step.

22. A method according to claim 18, wherein the temperature of the annealing step is in the range of about 700 to about 1000° C.

23. A method according to claim 18, wherein the etching step is performed for a duration of at least 30 seconds to about one hour.

24. A method according to claim 18, further comprising the step of epitaxially growing a heterostructure from the surface of the substrate.

25. A method according to claim 24, wherein the heterostructure is chosen from the group consisting of high-$T_c$ superconductor films, Josephson tunnel junctions, superlattices, and oxide channel field effect transistors.

26. A method according to claim 24, wherein the heterostructure is a cuprate film.

27. A method according to claim 24, wherein the heterostructure has a composition chosen from the group consisting of $YBa_2Cu_3O_{7-\delta}$, $La_2CuO_4$ and their families.

28. A method according to claim 24, wherein the heterostructure is deposited by pulsed laser deposition.

* * * * *